United States Patent [19]

Forsha

[11] Patent Number: 5,083,698
[45] Date of Patent: Jan. 28, 1992

[54] VACUUM TIP SURMO-WICK REMOVAL SYSTEM

[75] Inventor: Alan L. Forsha, Upland, Calif.

[73] Assignee: Solder Removal Company, Covina, Calif.

[21] Appl. No.: 485,205

[22] Filed: Feb. 26, 1990

[51] Int. Cl.$^5$ .............................................. B23K 1/018
[52] U.S. Cl. ............................. 228/160; 228/19; 228/264; 219/121.64
[58] Field of Search ................. 228/19, 20 R, 20 HT, 228/6.2, 191, 264, 160; 219/121.64

[56] References Cited

U.S. PATENT DOCUMENTS

| | | | |
|---|---|---|---|
| 3,627,191 | 12/1971 | Hood, Jr. | 228/19 |
| 3,945,553 | 3/1976 | Nicosia | 228/20 HT |
| 4,066,204 | 1/1978 | Wirbser et al. | 228/264 |
| 4,436,242 | 3/1984 | Shisler et al. | 228/264 |
| 4,805,827 | 2/1989 | Coffman et al. | 228/20 R |
| 4,934,582 | 6/1990 | Bertram et al. | 228/191 |

*Primary Examiner*—Kenneth J. Ramsey
*Attorney, Agent, or Firm*—Nilsson, Robbins, Dalgarn, Berliner, Carson & Wurst

[57] ABSTRACT

An effective, convenient, economical and safe system for installing and removing multi-sided gull-wing semiconductor devices from circuit boards without damaging the semiconductor device is provided. The solder removal system is formed by the combination of a surmo-multi-sided wick formed from welded braids and a solder removal gun that has been adapted with a corresponding multi-sided tip face with vacuum capability. An apparatus and process of using such apparatus thereof to produce the multi-sided shape surmo-wick used in the solder removal system are also provided.

5 Claims, 5 Drawing Sheets

VACUUM TIP SURMO-WICK REMOVAL SYSTEM

BACKGROUND OF THE INVENTION

1. Field of the Invention

The present invention relates to the fields of solder removal system for installing and removing microelectronic multi-sided surface mount ("surmo") devices; surmo-multi-sided wick; apparatus and techniques for producing such surmo wick from welded braid; modified multi-sided solder tip with vacuum capability and process of using such solder tip.

2. Description of the Prior Art

Solder removal systems, in general, are formed by the combination of a soldering iron for heating and a solder-pulling wick for removing such melted solder. Solder-pulling wicks, such as those disclosed in U.S. Pat. No. 3,627,191, entitled "Solder Wick" to Hood, which is incorporated herein by reference, have been used to quickly and economically remove a solder connection. Such wicks are made of metal, generally copper, strands braided to provide a capillary surface. Flux is applied to overcoat the wick so that flux need not be separately applied to the solder connection. In operation, the wick is placed on the solder connection and the connection is heated through the wick with a soldering iron, such as the commercial SC-5000 sold by Solder Removal Company or those disclosed in U.S. Pat. No. 3,990,863, entitled "Integrated-Circuit Block Extraction Tool", to Palmer, which is incorporated herein by reference. The solder melts and is drawn up into the wick by capillary forces. However, it has been found that though the conventional solder removal system works well on removing solder from conventional electronic components from a circuit board, it tends to damage the small gull-wing leads on a multi-sided semiconductor device during device installing or removal. The installing or removal process is also very cumbersome as solder has to be melted and/or removed one side at a time, leaving hot solder to flow at the edges which can damage the heat sensitive surface mount device ("SMD"). For example, the integrated-circuit block extraction tool as disclosed in U.S. Pat. No. 3,990,863 above, does not provide for means to remove the solder from each side of the device separately or simultaneously during the extraction process. Thus, the solder is likely to flow along the gull-wing leads during the solder melting step and will remain on the tip of the integrated circuit when it is extracted. This solder-flow and residue problem severely limits the block extraction tool's application in removal of multi-sided, such as rectangular or square, semiconductors mounted on the surface of a circuit board with sensitive gull-wing leads extending on four sides of the device.

SUMMARY OF THE INVENTION

An effective, convenient, economical and safe system for installing and removing multi-sided gull-wing semiconductor devices from circuit boards without damaging the semiconductor device is provided. The solder removal system is formed by the combination of a surmo-multi-sided wick formed from welded braids and a solder removal gun that has been adapted with a corresponding multi-sided inset tip face with vacuum capability.

In effect, the solder removal system eliminates the possibility that a surface mount multi-sided semiconductor device may be damaged from the amount of heat generated from the soldering gun during solder melting or removal process.

The solder removal system also allows easy, efficient and simultaneous removal of solder from multi-sided gull-wing leads of the semiconductor device and further reduces the hot solder flow and residue problem. In addition, the solder removal system provides the capability for removing solder from any geometrical shape of surface mount semiconductor device by using the corresponding geometrical shape solder removal wick and solder tip.

By providing vacuum capability to the modified soldering tip, excessive solder can further easily be removed from the multi-sided gull-wing leads of the device, onto the surmo-wick, then onto a filter, which can be an integral component of a soldering iron, such as the commercial SC-5000 discussed earlier.

An apparatus and process of using such apparatus thereof to produce the multi-sided shape surmo-wick used in the solder removal system are also provided.

The apparatus comprises a system controller that controls the operation of the whole apparatus, a side reel for feeding two or more strands of copper braid from a feed spool, a rung reel for feeding one or more strands of copper braid perpendicular to said first two or more strands of copper braid, a die with channels to receive all the strands of copper braid, lasers and their controllers, from which laser beams are being applied to the copper braids in the die to provide welding and a cutting lever to remove each multi-sided wick from the feed spools after the wick has been formed.

By adjusting the rung width, speed and timing of a stepper in feeding the copper braids, wicks of different dimensions and performance can be produced.

In addition, wicks of various geometrical shapes can be produced by changing the number of channels and feeding pattern of the braids into the die.

By varying the gauge size of the copper wire and number of strands and tucks in the braid used, wicks with different structures and performance can be easily produced.

To minimize reflection loss of the laser beam intensity during welding and to provide better welding of the wick, the laser beam is applied beyond the overlapping braids intersecting points to create a hole in the braids, the intersection of which constitutes the welded copper wires, creating the square or rectangular shapes of the ladder structure. This point of laser beam application is not at the laser focal point, but a short distance of about 0.005 inch from the focal point.

BRIEF DESCRIPTION OF THE DRAWINGS

The novel features which are believed to be characteristic of the invention are set forth with particularity in the appended claims. The invention itself, however, both as to its organization and method of operation, may best be understood by reference to the following description taken in connection with the accompanying drawings, wherein similar characteristics refer to similar elements throughout and in which:

FIG. 8b is a plan close-up view of a "cap" of the rectangular soldering tip taken along the direction of line A—A of FIG. 8a.

DETAILED DESCRIPTION

Figure 1:
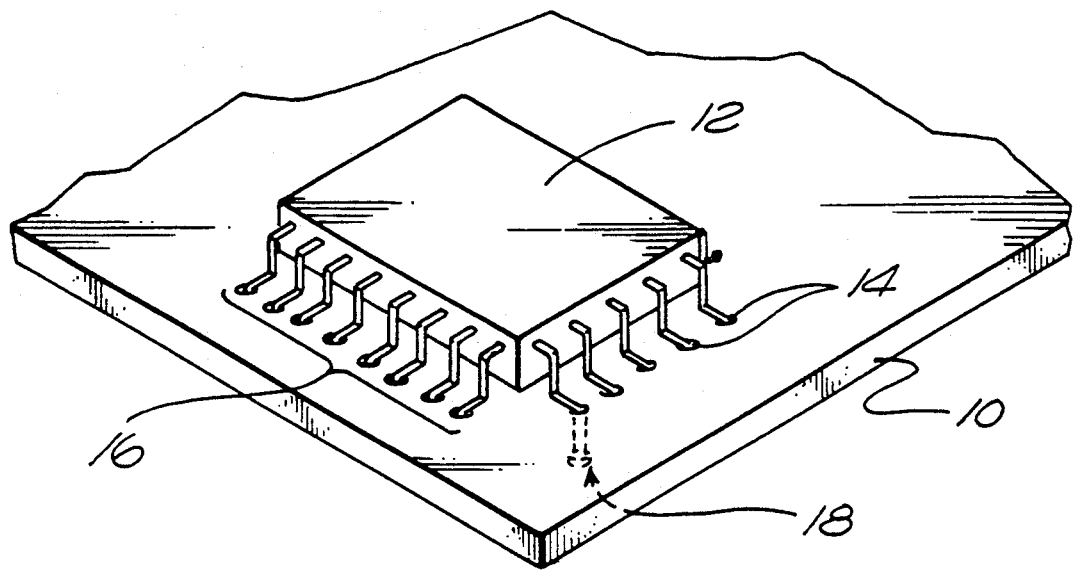
FIG. 1 is a perspective view of a SMD with gull-wing leads on a printed circuit board from which the solder is to be removed.

Referring to FIG. 1, a printed circuit board 10 is shown having a SMD 12 thereon. The SMD 12 has gull-wing leads 16 around and along its four sides. Each gull-wing lead passes through a lead hole 14 and is affixed beneath the board 10 by a small globule of solidified solder 18. To avoid shorting between adjacent gull-wing leads, each globule of solder 18 is isolated and does not come into contact with one another. The SMD 12 are well-known and include an OAK VGA OTI-037 chip or a PALGMIPS RISC by Performance Semiconductor Corporation. In the event of a faulty connection, or for any reason the SMD needs to be replaced, one may remove all the solder globules 18 simultaneously by utilizing a solder pulling wick 20 of this invention.

Figure 2:
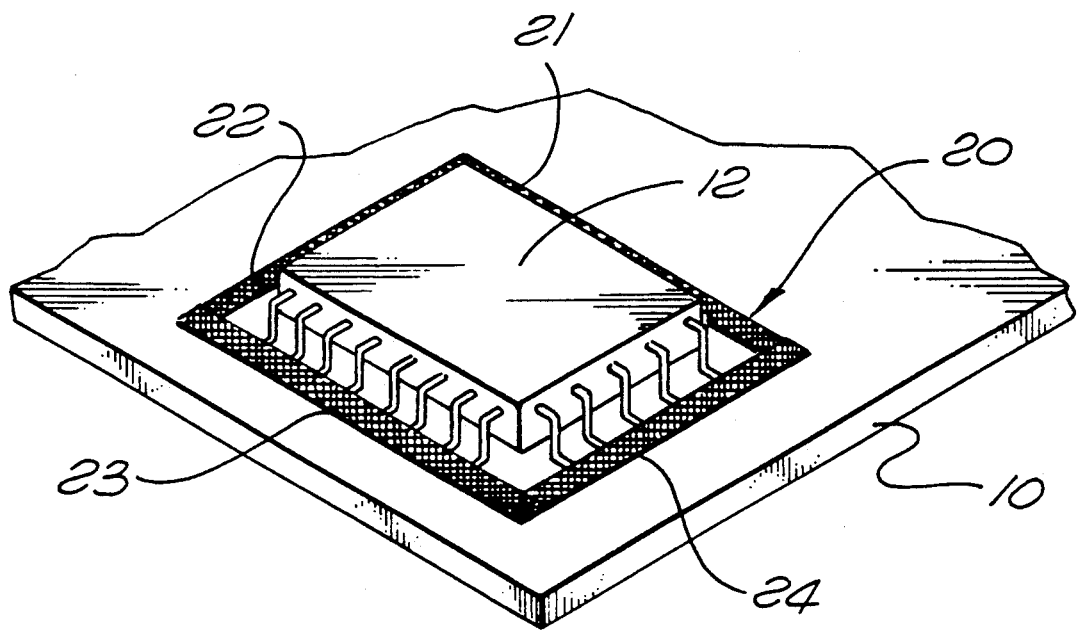
FIG. 2 is a perspective view of a rectangular solder-pulling closed wick of this invention placed on the gull-wing leads of the SMD from which solder is to be removed.

Referring now to FIG. 2, the rectangular wick 20 is shown with edges 21-24 thereof overlaying all the solder globules 18. Other geometrical shapes of the wick such as hexagonal, circular or the like, can also be used to fit the particular shape of the SMD's leads from which solder is to be removed.

Figure 3A:
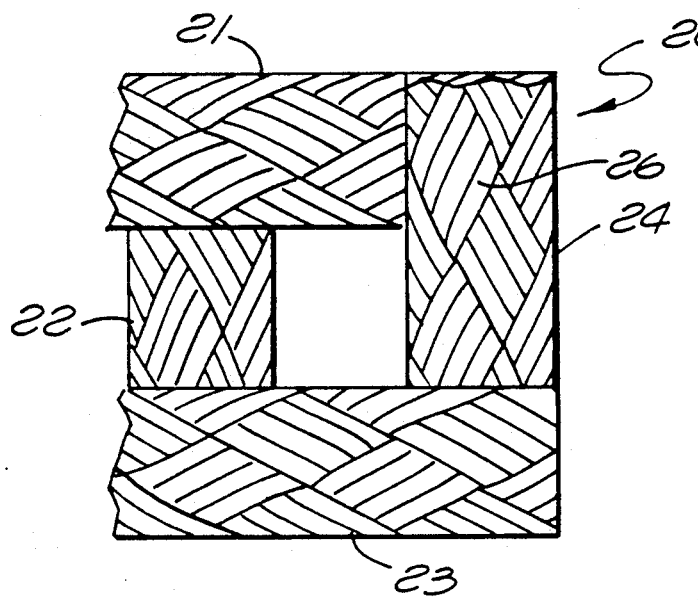
FIG. 3 is a plan close up view of one embodiment, a ladder-shaped solder-pulling wick, from which a rectangular piece is cut and depicted in FIG. 2.
Figure 3B:
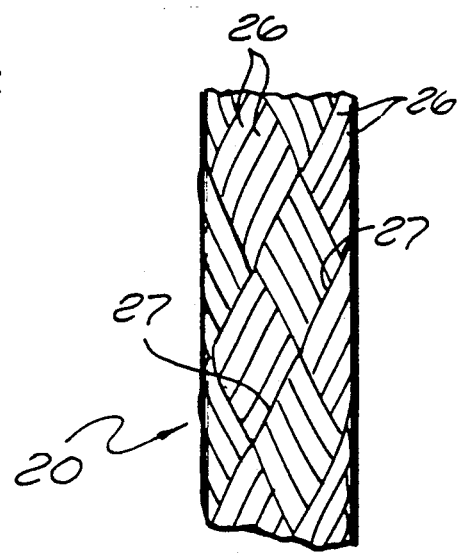

Referring to FIG. 3a, the wick 20 comprises the four edges 21-24, each formed from a braided strand 26 of copper wire and entirely overcoated with flux such as those described in U.S. Pat. No. 3,627,191 above. In one embodiment, the wire is of 40-gauge size and each strands 26 are in groups of four. Each edge of the wick 20 is braided from a machine housing 16 heads so that each side of the wick is 64 strands thick with 23 tucks 27 per inch. Other grades of wire and braiding patterns can be used, e.g., 36, 96, 120 and 196 and strands of 40, 42, and 44 gauge wire can be braided in 16 groups of six strands, etc. for each edge.

Figure 3C:
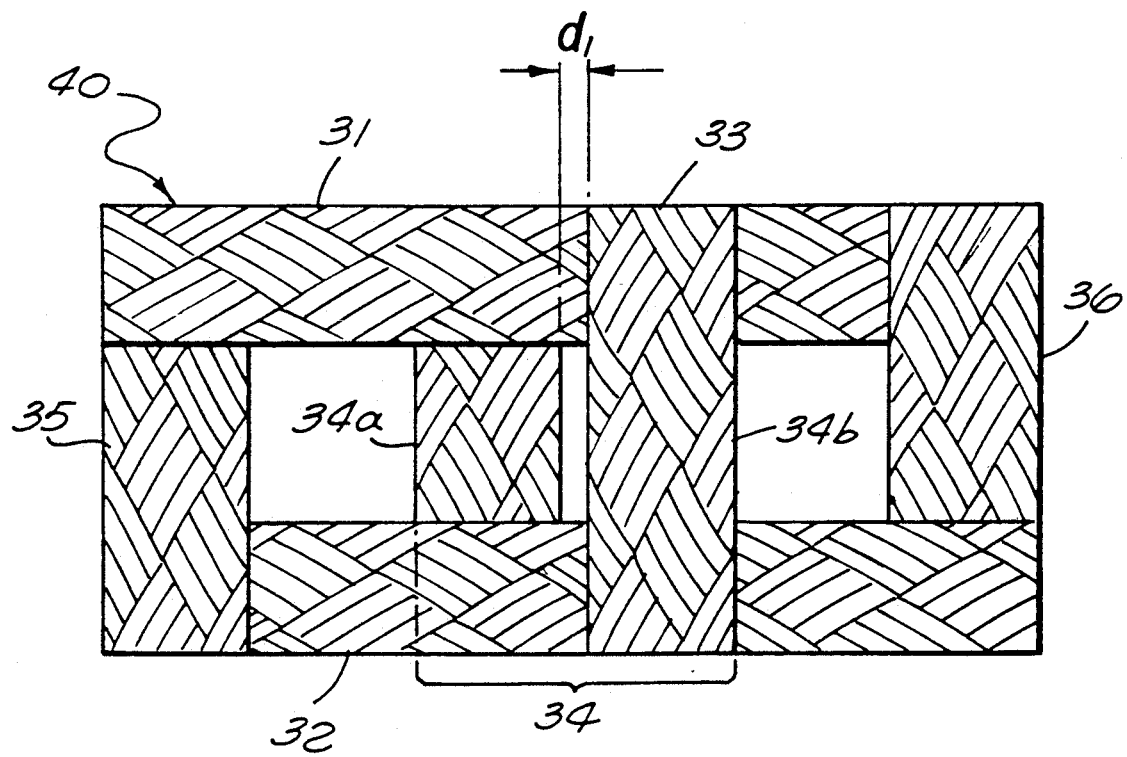

In general, the rectangular wick 20 can be cut from a ladder-shaped wick 40 (see FIG. 3c) comprising two legs 31 and 32 and various steps 33. Except the first (35) and the last steps (36), which are single steps, the intermediate steps 34 are double steps comprising two braids of copper wire 34a and 34b separated by a short distance $d_1$ between them. The strands 31, 32, 33, 34a, 34b, 35 and 36 are all welded together by laser welding.

Figure 4:
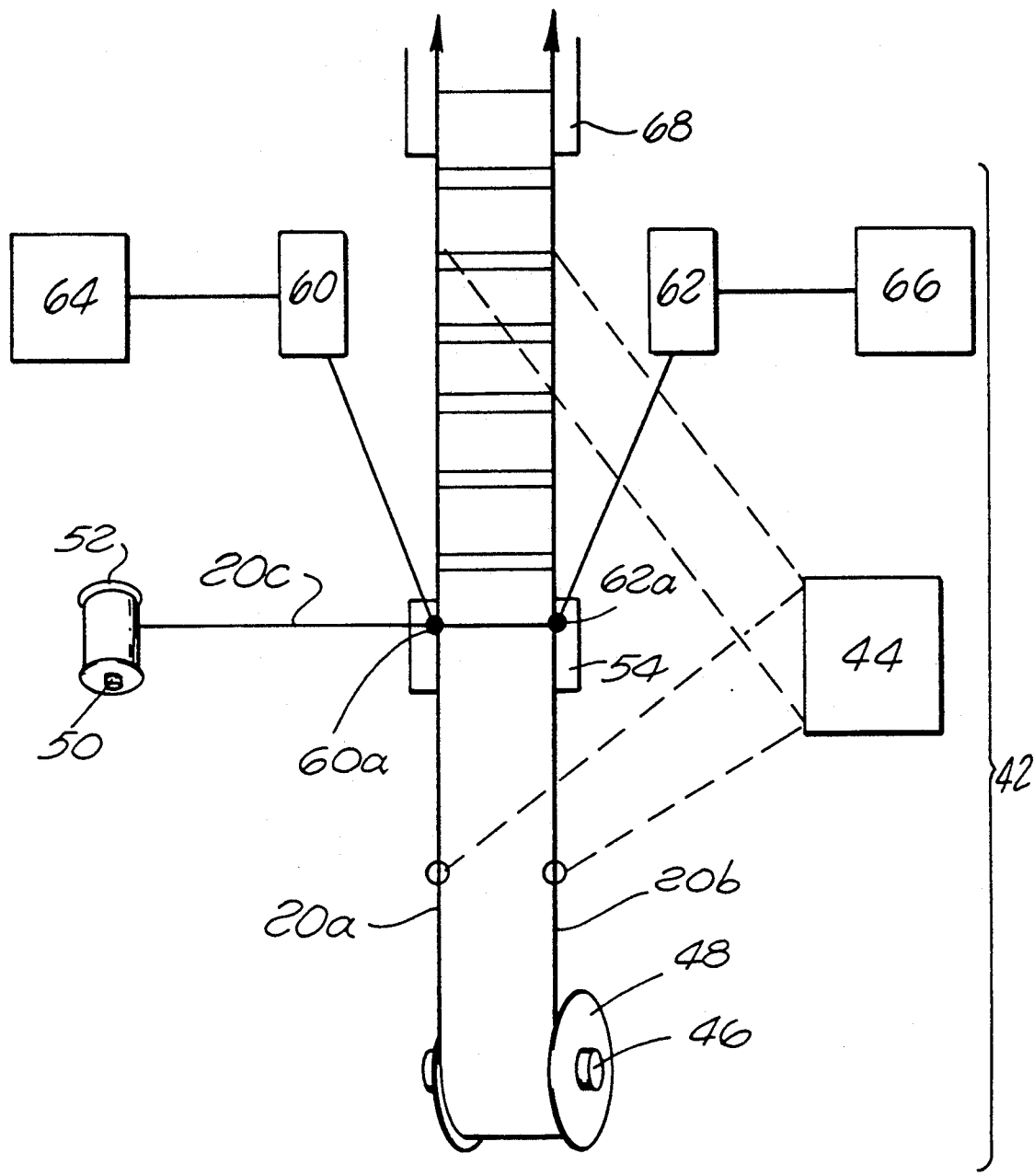
FIG. 4 illustrates an apparatus for producing the ladder-shaped solder-pulling wick as depicted in FIG. 3.
Figure 5:
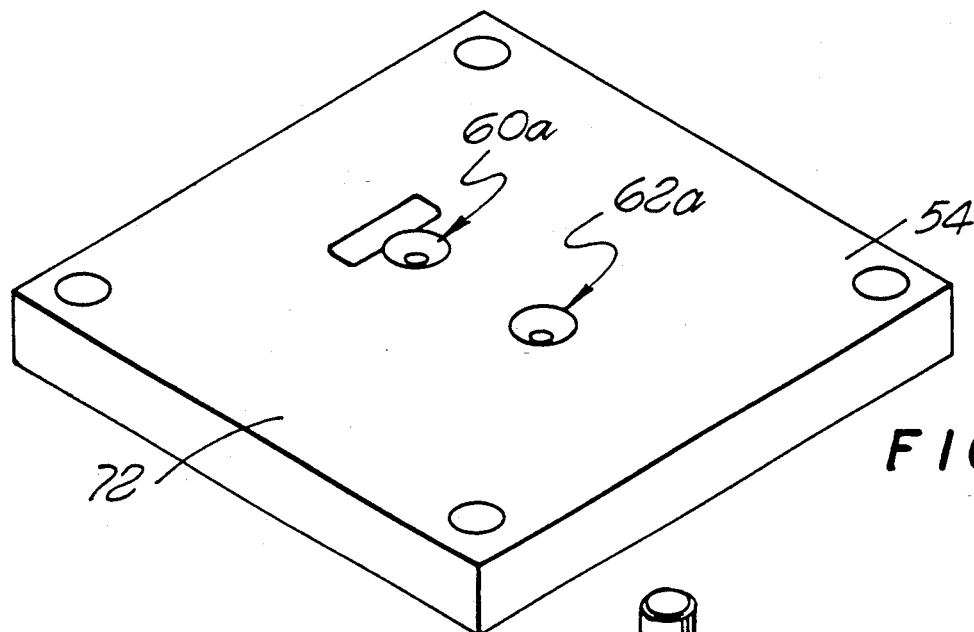
FIG. 5 illustrates a perspective view of the top of a die used in the apparatus depicted in FIG. 4 for producing the ladder-shaped solder-pulling wick.
Figure 6:
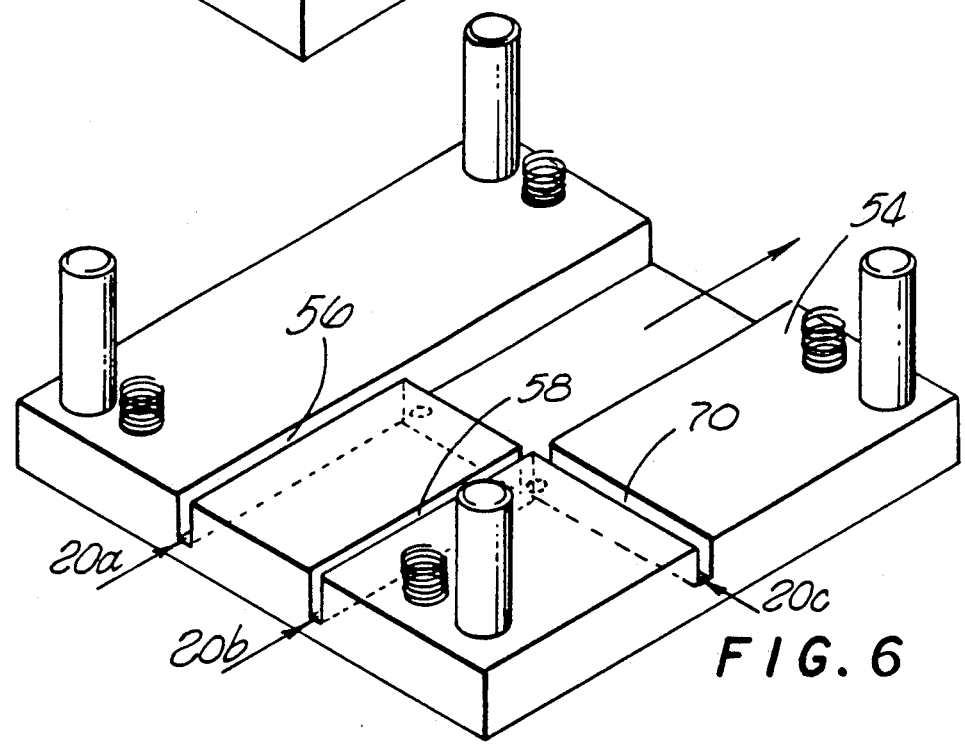
FIG. 6 illustrates a perspective view of the bottom of the die used in the apparatus depicted in FIG. 4.

Referring to FIGS. 4-6, an apparatus 42 for producing the ladder-shaped solder pulling wick is illustrated.

Figure 7:
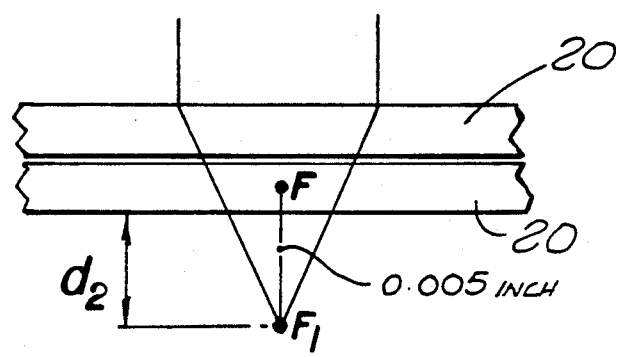
FIG. 7 illustrates the optical path of the laser used to weld strands of solder-pulling wick into a ladder shape.

The laser welder-ladder stepper apparatus 42 comprises a system controller 44 that controls the operation of the whole apparatus; a ladder side reel 46 with two strands of copper braid 20a and 20b installed on a feed spool 48; a rung reel 50 on a feed spool 52 with a single strand of copper braid 20c wherein the double strands of copper braid 20a and 20b and the single strand 20c are being fed to a die 54 through channels 56, 58 and 70, respectively; two lasers 60 and 62, with laser controllers 64 and 66, which may be dependent or independent from the system controller 44, are being applied in a vertical position directly through holes 60a and 62a incident onto the strands of copper braid in a wick structure, but applying for welding at a distance $F_1$, instead of F, the focal distance of the laser, from the wick to minimize reflection loss of the laser beam (see FIG. 7); and a cutting lever 68 used to cut off the rectangular strip after the ladder shape wick has been formed.

During operation, a specific size of rectangular wick to be produced is first selected and the data entered into the controller. Ladder side reel 46 is then installed on feed spool 48, followed by installing the rung reel 50 onto the feed spool 52. Laser power needed to provide welding of the copper braid ladder is then selected and the data entered into the laser controllers 64 and 66. Further, the lasers 60 and 62 are being applied at a distance $d_2$ from the wick to minimize reflection of the laser light from the reflective copper surface of the wick and to provide sufficient power for welding. Rung width, speed and timing of stepper are then set on the controller. Each of the three strands of copper braid 20a, 20b and 20c, used to form the ladder is then threaded to the starting point through the die 54 for take up. The double strands 20a and 20b of copper braid from the ladder side reel is fed simultaneously, one in each channel 56 and 58, in a longitudinal direction into the die 54 while the third strand 20c from the rung reel is fed perpendicular to the double strands through braid entry 70. The die face 72 is then closed and controller 44 is put in run mode. As the ladder-shape wick emerges from the die 54 after laser welding, cutting lever 68 cuts it into rectangular wicks.

Anytime during operation, the apparatus can be used to produce different wick sizes by reprogramming the rung width, speed and timing of stepper settings in the controller 44. In addition, the apparatus can be stopped and the die 54 opened to replace the copper strands in order to produce wicks of different dimensions.

Figure 8A:
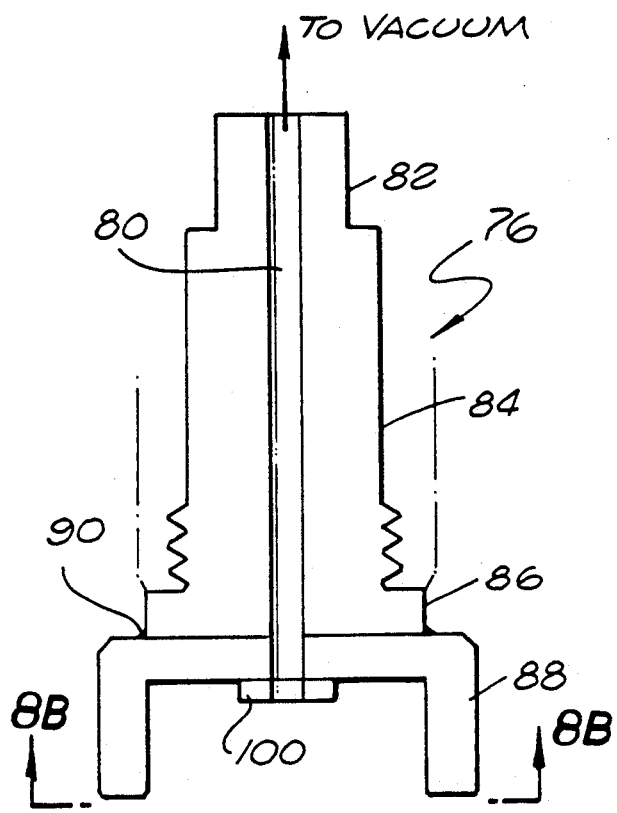
FIG. 8a is a perspective view of a modified rectangular soldering tip to be used with the rectangular solder-pulling closed wick of this invention to remove solder from the gull-wing lead of a SMD.
Figure 8B:
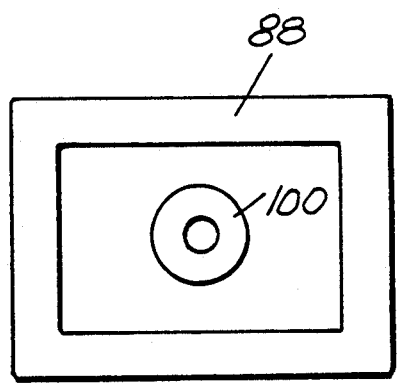

FIGS. 8a-b show a modified rectangular soldering tip 76 poised above a wick 20 which, in turn, is positioned over a SMD 12 to be extracted from a printed circuit board 10. The soldering tip 76 is to be received into a barrel of a soldering iron such as that disclosed is U.S. Pat. No. 4,086,465 to Sylvester or the commercial SC-5000 sold by Solder Removal Company described earlier. Structurally, the tip 76 includes a hollow central section 80, the lower end of which is of enlarged diameters 82, 84 and 86, respectively, and is welded to the cap 88 at the connection 90. The cap is of a rectangular or square shape, being of a size to be fitted over the gull-wing leads of the SMD 12. A circular insulating spacer 100 with a central hollow opening for the vacuum is provided for the cap to prevent overheating of the SMD during the solder removal process. The portion of the hollow central section 80 just above the connection 90 to the cap can be provided with threads to facilitate easy receiving into the end block of a soldering iron.

Figure 9:
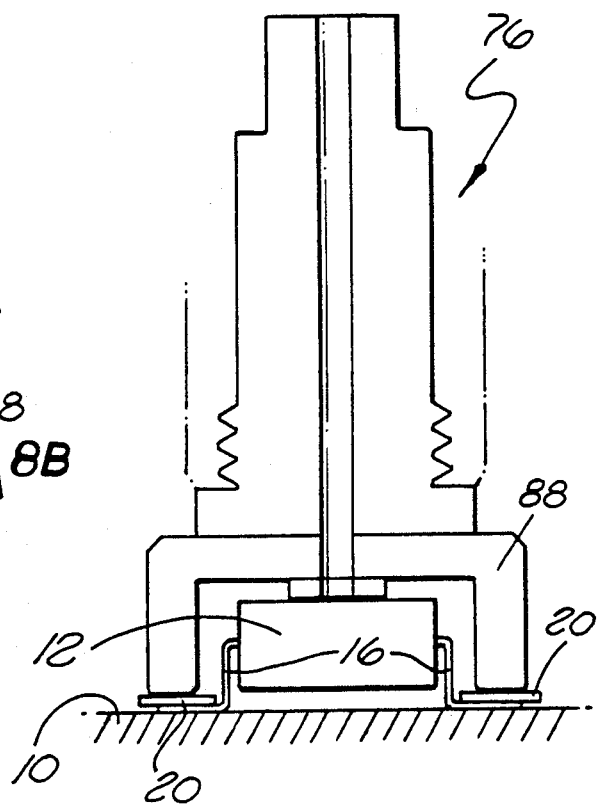
FIG. 9 is a perspective, cross-sectional view of the vacuum-tip surmo-wick solder removal system of this invention in operation, removing solder from gull-wing leads of a SMD.

As shown in FIG. 9, during operation, a rectangular or square piece of wick is placed on the SMD over the gull-wing leads. The cylindrical section 88 of the soldering tip 76 is then telescopically received into the tube of a soldering iron. The rectangular or square tip is then placed over the wick which, in turn, is placed over the SMD. As the soldering iron is heated up, the solder underneath the gull-wing leads is melted and drawn up into the wick by capillary action and vacuum suction.

Those skilled in the art will fully appreciate that the preferred embodiments shown are desirable to illustrate the invention and are exemplary only and that the same principles may be employed in providing a vacuum tip surmo wick removal system for accommodating different sizes and shapes of microelectronic surface mount devices. It will be further appreciated that various other minor modifications or changes, particularly with respect to details of system construction, might be made without departing from the gist and essence of the invention. Accordingly, it should be further understood that the invention should be deemed limited only by the scope of the claims which follow and should be interpreted as encompassing all system constructions fairly regardable as functional equivalents of the subject matter to which claims are directed.

Having described my invention, what I claim and desire to secure by letters patent is:

1. An apparatus for producing a multi-sided surmo wick used for installing and removing microelectronic multi-sided surface mount devices comprising:
   a system controller that controls the operation of said apparatus;
   a side reel for feeding at least two strands of copper braid from a feed spool;
   a rung reel for feeding at least one strand of copper braid perpendicular to said at least two strands of copper braid;
   laser controllers to control laser beams being applied at a distance of at least 0.002 inch away from a focus of said laser beams to minimize reflection loss of said laser during welding; and
   a cutting lever to remove each multi-sided wick from said feed spool after said wick has been formed.

2. An apparatus as set forth in claim 1, wherein said controllers include means for controlling rung width, speed and timing of a stepper in feeding said copper braids to produce wicks of different dimensions and performance.

3. An apparatus as set forth in claim 1, wherein said strands of copper braid are of at least two in number and can be fed into said die through corresponding channels to produce wicks of a geometrical shape that fits telescopically over said surface mount device.

4. An apparatus as set forth in claim 1, wherein said copper strands used are braided from copper wire of a diameter of at least 26 gauge size and of at least 36 strands thick with at least 10 tucks per inch.

5. A process for producing a multi-sided wick useful for installing and removing microelectronic multi-sided surface mount devices comprising the steps of:
   controlling the operation of an apparatus for producing said wick with a system controller;
   feeding at least two strands of copper braid from a side reel feed spool;
   feeding at least one strand of copper braid perpendicular to said at least two strands of copper braid from a rung reel;
   receiving all said strands of copper braid in a die with channels;
   controlling laser beams being applied at a distance of at least 0.002 inch away from a focus of said laser beam to minimize reflection loss of said laser during welding with a laser controller; and
   removing each multi-sided wick from said feed spool after said wick has been formed with a cutting lever.

* * * * *